(12) United States Patent
Sakong et al.

(10) Patent No.: US 11,398,500 B2
(45) Date of Patent: Jul. 26, 2022

(54) LED LIGHTING DEVICE PACKAGE AND DISPLAY PANEL USING THE SAME

(71) Applicant: SAMSUNG ELECTRONICS CO., LTD., Suwon-si (KR)

(72) Inventors: Tan Sakong, Seoul (KR); Sammook Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 180 days.

(21) Appl. No.: 16/752,187

(22) Filed: Jan. 24, 2020

(65) Prior Publication Data

US 2021/0013236 A1 Jan. 14, 2021

(30) Foreign Application Priority Data

Jul. 8, 2019 (KR) .................. 10-2019-0082254

(51) Int. Cl.
*H01L 27/12* (2006.01)
*H01L 27/15* (2006.01)
(Continued)

(52) U.S. Cl.
CPC ........ *H01L 27/1214* (2013.01); *H01L 27/156* (2013.01); *H01L 33/38* (2013.01); *H01L 33/505* (2013.01); *H01L 33/54* (2013.01)

(58) Field of Classification Search
CPC .. H01L 27/156; H01L 25/167; H01L 25/0753
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

KR   10-2018-0078940 A   7/2018
KR   10-1890582 B1       8/2018
KR   10-1913230 B1       10/2018

OTHER PUBLICATIONS

Julien Happich ("14,000 ppi MicroLED display is world's densest, only 0.48mm across," EENewsEurpoe, published Jun. 3, 2019, accessed at http://www.eenewseurope.com/news/14000ppi-microled-display-worlds-densest-only-048mm-across) (Year: 2019).*

*Primary Examiner* — Stephen M Bradley
(74) *Attorney, Agent, or Firm* — Sughrue Mion, PLLC

(57) ABSTRACT

A light emitting device package includes: a plurality of light emitting structures, each having a first conductivity-type semiconductor layer, an active layer, and a second conductivity-type semiconductor layer; a common first electrode extended in parallel with first and second surfaces of the plurality of light emitting structures at a level different from levels of the first and second surfaces while connecting respective first conductivity-type semiconductor layers of the plurality of light emitting structures; a plurality of second electrodes connected to respective second conductivity-type semiconductor layers of the plurality of light emitting structures; a plurality of wavelength converters; and a molded portion having a partition wall structure separating the plurality of wavelength converters from each other, and including a material having a modulus lower than a modulus of the plurality of light emitting structures.

20 Claims, 13 Drawing Sheets

(51) Int. Cl.
  *H01L 33/38*     (2010.01)
  *H01L 33/54*     (2010.01)
  *H01L 33/50*     (2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,354,679 B1 | 1/2013 | D'Evelyn et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,128,308 B1 | 11/2018 | Shin et al. |
| 10,224,365 B2 | 3/2019 | Wu et al. |
| 2015/0362165 A1* | 12/2015 | Chu ............... H01L 27/156 362/235 |
| 2017/0250318 A1* | 8/2017 | Cha ............... H01L 33/504 |
| 2017/0309798 A1 | 10/2017 | Bonar et al. |
| 2018/0166424 A1* | 6/2018 | Sim ............... H01L 25/0753 |
| 2019/0189679 A1 | 6/2019 | Kwak et al. |
| 2020/0035748 A1* | 1/2020 | Xia ............... H01L 33/32 |
| 2020/0411738 A1* | 12/2020 | Kim ............... H01L 33/56 |

* cited by examiner

LED LIGHTING DEVICE PACKAGE AND DISPLAY PANEL USING THE SAME

CROSS-REFERENCE TO RELATED APPLICATION(S)

This application claims priority from Korean Patent Application No. 10-2019-0082254 filed on Jul. 8, 2019 in the Korean Intellectual Property Office, the disclosure of which is incorporated herein by reference in its entirety.

BACKGROUND

1. Field

Example embodiments of the disclosure relate to a light emitting device package and a display panel using the same.

2. Description of Related Art

Semiconductor light emitting diodes (LED) have been used as light sources for various electronic products, as well as light sources for lighting devices. In particular, semiconductor LED devices are widely being used as light sources for various types of display panels such as TVs, mobile phones, PCs, laptop PCs, and PDAs.

The related art display panels include display panels, commonly liquid crystal display (LCD) panels, as well as backlight units; however, recently, display devices which use an LED device as a single pixel and thus does not require an additional backlight have been under development. Such display panels may be compact, and may implement high brightness displays having improved optical efficiency as compared to the related art LCD panels. Also, such display panels may also allow an aspect ratio of a display image to be freely changed, and may implement large display panels, thereby providing various forms of large displays.

SUMMARY

One or more example embodiments provide a light emitting device package and a display panel, capable of reducing manufacturing costs and obtaining miniaturization, and a method of manufacturing the same.

One or more example embodiments also provide a method of manufacturing a display panel having flexibility.

According to an aspect of an example embodiment, provided is a light emitting device package, including: a plurality of light emitting structures spaced apart from each other, each of the plurality of light emitting structures having a first conductivity-type semiconductor layer, an active layer, a second conductivity-type semiconductor layer, a first surface provided by the first conductivity-type semiconductor layer, and a second surface provided by the second conductivity-type semiconductor layer, the first surface facing the second surface; a common first electrode extended in parallel with first surfaces and second surfaces of the plurality of light emitting structures at a level different from levels of the first surfaces and the second surface, the common first electrode connecting respective first conductivity-type semiconductor layers of the plurality of light emitting structures, and including at least one of tungsten (W) and tungsten silicide (WS); a plurality of second electrodes disposed on the second surfaces of the plurality of light emitting structures, and connected to respective second conductivity-type semiconductor layers of the plurality of light emitting structures; a plurality of wavelength converters disposed on the first surfaces and spaced apart from each other to correspond to the plurality of light emitting structures; and a molded portion covering side surfaces of the plurality of light emitting structures and side surfaces of the plurality of wavelength converters, the molded portion having a partition wall structure separating the plurality of wavelength converters from each other, and including a material having a modulus lower than a modulus of the plurality of light emitting structures.

According to an aspect of an example embodiment, provided is a light emitting device package, including: a plurality of light emitting structures spaced apart from each other, each of the plurality of light emitting structures having a first conductivity-type semiconductor layer, an active layer, a second conductivity-type semiconductor layer, a first surface provided by the first conductivity-type semiconductor layer, and a second surface provided by the second conductivity-type semiconductor layer, the first surface facing the second surface; a plurality of wavelength converters disposed to correspond to the plurality of light emitting structures and spaced apart from each other; a molded portion covering side surfaces of the plurality of light emitting structures and side surfaces of the plurality of wavelength converters and separating the plurality of light emitting structures and the plurality of wavelength converters from each other; a common first electrode connecting respective first conductivity-type semiconductor layers of the plurality of light emitting structures to each other, the common first electrode being extended in parallel with the first surface and the second surface at a level different from levels of the first surface and the second surface; and a plurality of second electrodes connected to second conductivity-type semiconductor layers, respectively, on second surfaces of the plurality of light emitting structures.

According to an aspect of an example embodiment, provided is a display panel, including: a first substrate structure including a plurality of light emitting device packages arranged in rows and columns, each of the plurality of light emitting device packages providing at least one pixel; and a second substrate structure including a plurality of thin film transistor (TFT) cells corresponding to the plurality of light emitting device packages, respectively, and arranged at a lower portion of the first substrate structure, and the plurality of light emitting device packages include: a plurality of light emitting structures spaced apart from each other and providing a plurality of sub-pixels of a pixel, each of the plurality of light emitting structures having a first conductivity-type semiconductor layer, an active layer, a second conductivity-type semiconductor layer, a first surface provided by the first conductivity-type semiconductor layer, and a second surface provided by the second conductivity-type semiconductor layer, the first surface facing the second surface; a common first electrode connecting respective first conductivity-type semiconductor layers of the plurality of light emitting structures to each other and extended in parallel at a level different from levels of first surfaces and second surfaces of the plurality of light emitting structures; a plurality of second electrodes disposed on the second surfaces of the plurality of light emitting structures, and connected to respective second conductivity-type semiconductor layers of the plurality of light emitting structures; a plurality of wavelength converters disposed on the first surfaces and spaced apart from each other to correspond to the plurality of light emitting structures; a molded portion covering side surfaces of the plurality of light emitting structures and side surfaces of the plurality of wavelength converters; and a first electrode pad and a second electrode pad passing through the molded portion and respectively connecting each of the common first electrode and the plurality of second electrodes to a connection portion of the second substrate structure.

BRIEF DESCRIPTION OF DRAWINGS

The above and/or other aspects of the disclosure will become apparent and more readily appreciated from the following description of the example embodiments, taken in conjunction with the accompanying drawings, in which.

DETAILED DESCRIPTION

Hereinafter, example embodiments of the disclosure will be described in detail with reference to the attached drawings.

Figure 1:
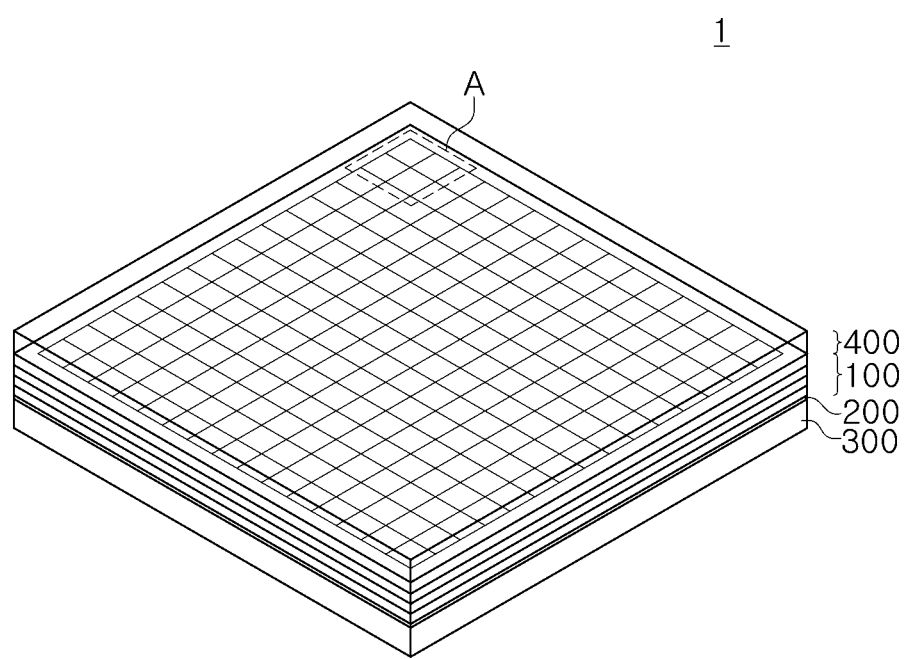
FIG. 1 is a schematic perspective view of a display panel having a light emitting device package according to an example embodiment of the disclosure.
Figure 2:
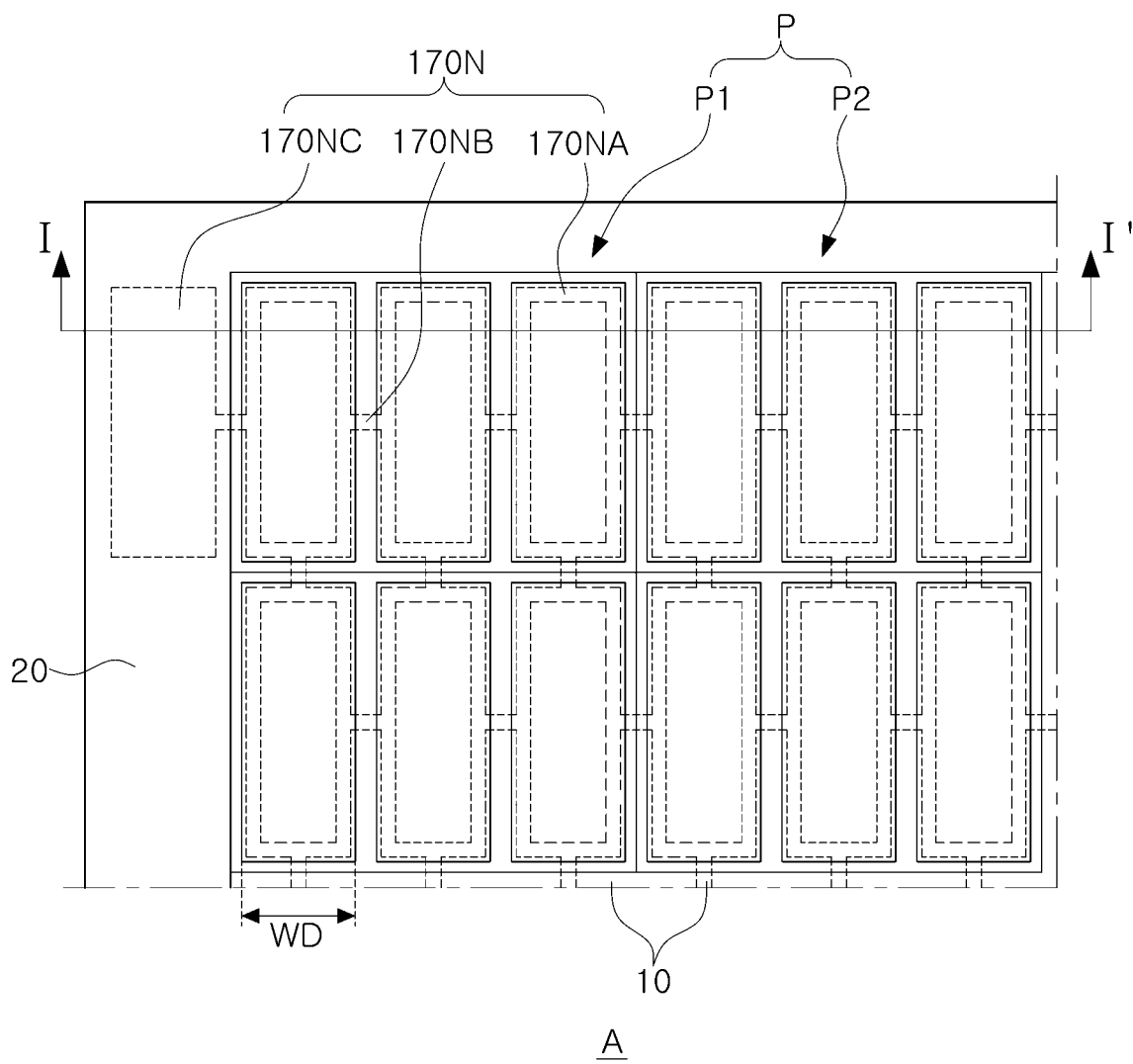
FIG. 2 is a plan view of portion 'A' of FIG. 1.
Figure 3:
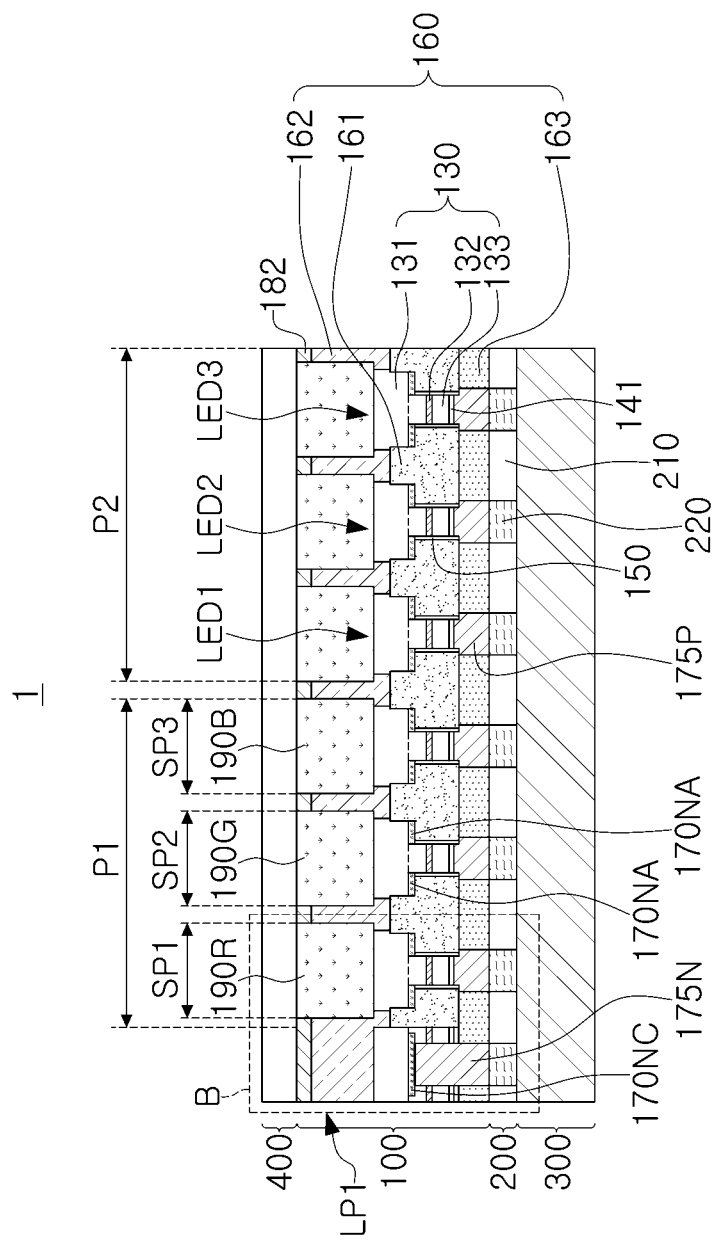
FIG. 3 is a side cross-sectional view taken along line I-I' of FIG. 2.
Figure 4A:
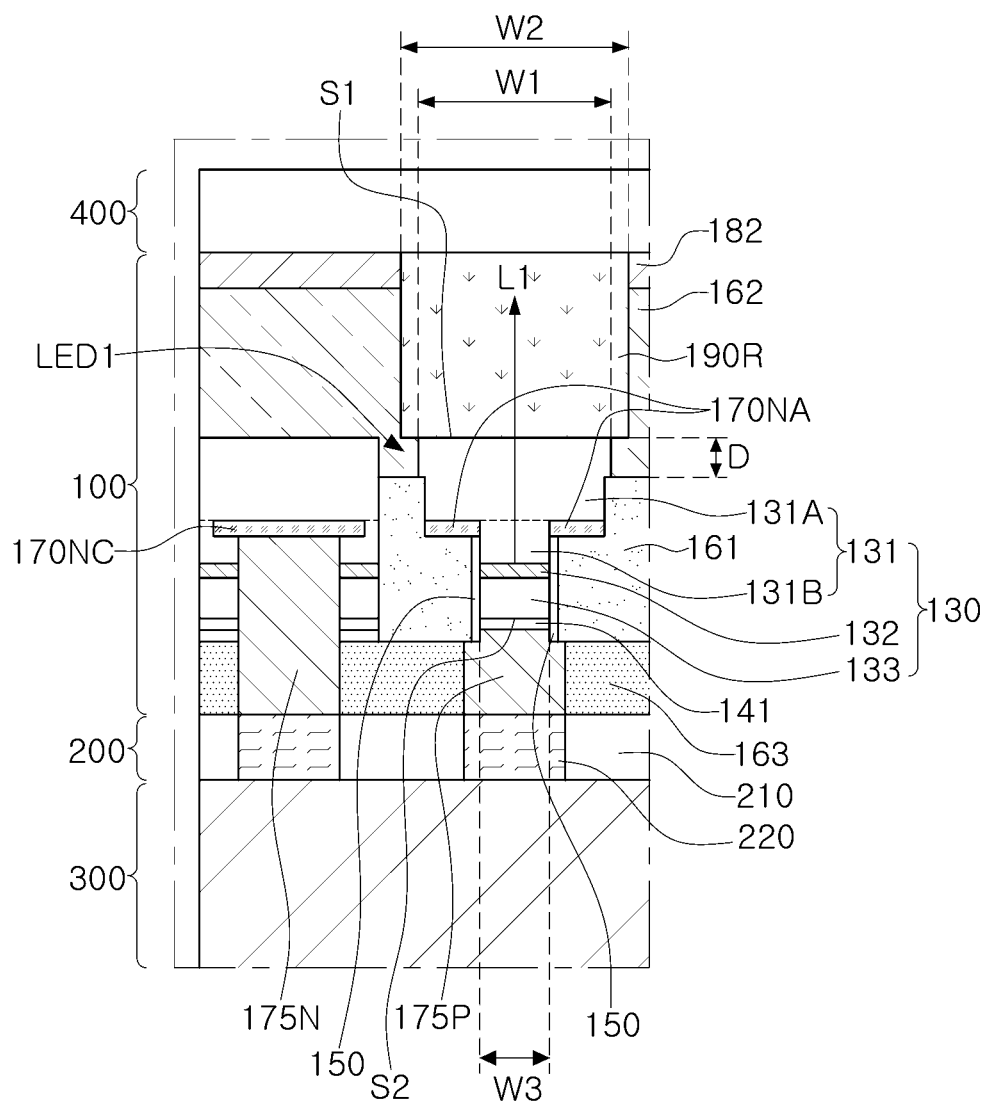
FIG. 4A is an enlarged view of portion 'B' of FIG. 3.

FIG. 1 is a schematic plan view of a display panel having a light emitting device package according to an example embodiment of the disclosure, and FIG. 2 is a plan view of portion 'A' of FIG. 1. FIG. 3 is a side cross-sectional view taken along line I-I' of FIG. 2, and FIG. 4A is an enlarged view of portion 'B' of FIG. 3.

Referring to FIG. 1, a display panel 1 according to an example embodiment of the disclosure may include a first substrate structure 100 including a light emitting element package, and a second substrate structure 300 disposed in a lower portion of the first substrate structure 100 and including a driving circuit unit. A protective layer 400 may be disposed on an upper surface of the first substrate structure 100, and a bonding layer 200 may be disposed between the first substrate structure 100 and the second substrate structure 300. The display panel 1 may have a rectangular shape or any other suitable shape. The display panel 1 may have a characteristic of being flexible. Thus, the upper surface of the display panel 1 may have a profile having a flat surface and/or a curved surface. The display panel 1 according to an example embodiment may be a display panel which is ultra compact and having a high-resolution, and may be used for a head set for virtual reality or augmented reality.

Referring to FIG. 2, the first substrate structure 100 may include a pixel region 10 and a molding region 20 surrounding the pixel region 10. In the pixel region 10, a plurality of pixels P may be arranged in a column and a row. It is illustrated that the plurality of pixels P according to an example embodiment form an array in a rectangular form of 15×15. However, this is merely an example given for convenience of explanation, and the number of columns and rows may be any appropriate number (for example, 1024× 768, 1920×1080, 3840×2160, and 7680×4320). The plurality of pixels may be arranged in various shapes other than a rectangle. The plurality of pixels P may be electrically connected to each other. Also, the plurality of pixels P may not be individually or separately manufactured, but the may be manufactured at the same operation at one time.

In an example embodiment, the plurality of pixels P may be disposed to have a density, for example, equal to or more than 8000 pixels per inch (PPI). Each of the plurality of pixels P may have a width of about 3 m or less.

The molding region 20 may be disposed around the pixel region 10. The molding region 20 may include a black matrix. For example, the black matrix is disposed in a peripheral region of the first substrate structure 100 to serve as a guide line defining a region in which the plurality of pixels P are arranged. The black matrix is not limited to black. A white matrix or a green matrix may be used as the black matrix depending on purposes or uses of products, and a matrix formed of a transparent material may be used in place of the black matrix depending on an embodiment. In the molding region 20, a pad portion 170NC of a common first electrode 170N, which will be described later, may be disposed.

Referring to FIGS. 3 and 4A, each of the plurality of pixels P may include a first substrate structure 100 and a second substrate structure 300, vertically stacked. The first substrate structure 100 and the second substrate structure 300 may be bonded by the bonding layer 200. The protective layer 400 may be bonded to an upper portion of the first substrate structure 100. The first substrate structure 100 and the second substrate structure 300 may be bonded to each other and integrated, by using a wafer bonding method, such as fusion bonding at a wafer level.

The plurality of pixels P may be provided as a plurality of pixels including a first pixel P1 and a second pixel P2. Hereinafter, for convenience of description, the first and second pixels P1 and P2 will be mainly described. Each of the first and second pixels P1 and P2 includes a plurality of subpixels SP1, SP2, and SP3, and each of the plurality of subpixels SP1, SP2, and SP3 may include one of a first semiconductor light emitting portion LED1, a second semiconductor light emitting portion LED2, and a third semiconductor light emitting portion LED3. In an example embodiment, each of the plurality of subpixels SP1, SP2, and SP3 may have a width WD of about 1.2 m or less.

The first substrate structure 100 may include a light emitting device package LP1 including the first to third semiconductor light emitting portions LED1, LED2, and LED3. The light emitting device package LP1 may include a first electrode pad 175N and a second electrode pad 175P connected to each of the first to third semiconductor light emitting portions LED1, LED2, and LED3, a first wavelength converter 190R, a second wavelength converter 190G, and a third wavelength converter 190B, disposed on the first to third semiconductor light emitting portions LED1, LED2, and LED3, respectively, and a molded portion 160 encapsulating the semiconductor light emitting portions LED1, LED2, and LED3, as well as the first to third wavelength converters 190R, 190G, and 190B. The molded portion 160 may include a first molded portion 161, a second molded portion 162, and a third molded portion 163.

Each of the first to third semiconductor light emitting portions LED1, LED2, and LED3 may include a light emitting structure 130 in which epitaxial layers such as a first conductivity-type semiconductor layer 131, an active layer 132, and a second conductivity-type semiconductor layer 133 are stacked. The epitaxial layers may be grown using the same operation on one wafer. Thus, active layers 132 of the first to third semiconductor light emitting portions LED1, LED2, and LED3 may be configured to emit the same light. For example, the active layer 132 may emit blue light (for example, light having wavelength in a range of 440 nm to 460 nm). The first to third semiconductor light emitting portions LED1, LED2, and LED3 may have the same structure.

The first conductivity-type semiconductor layer 131 and the second conductivity-type semiconductor layer 133 may be an n-type semiconductor layer and a p-type semiconductor layer, respectively. For example, the semiconductor layer may be a nitride semiconductor of $Al_xIn_yGa_{(1-x-y)}N$ ($0 \le x \le 1$, $0 \le y \le 1$, and $0 \le x+y \le 1$). The active layer 132 may have a multiple quantum well (MQW) structure in which quantum well layers and quantum barrier layers are alternately stacked on each other. For example, the active layer 132 may be a nitride-based MQW such as InGaN/GaN or GaN/AlGaN, but is not limited thereto. Alternatively, the active layer may be another semiconductor such as GaAs/AlGaAs, InGaP/GaP, or GaP/AlGaP. Among them, some regions of the first conductivity-type semiconductor layer 131 may be selectively etched to have a stepped side surface.

Referring to FIG. 4A, the light emitting structure 130 may be formed to allow a width W1 of the first surface S in contact with the wavelength converter 190R to be greater than a width W3 of the second surface S2 in a lower portion. In addition, the width W1 of an upper surface of the light emitting structure 130 is formed to be less than a width W2 of the wavelength converter 190R, so that the light emitting structure 130 may be limitedly disposed in a region overlapping the wavelength converter 190R. Due to such a structure, light L1 toward the wavelength converter 190R in an upper direction, of light emitted by the active layer 132 of the light emitting structure 130, may be emitted through the wavelength converter 190R without any obstacles on an optical path. That is, the first conductivity-type semiconductor layer 131 may have a structure in which a first lower conductivity-type semiconductor layer 131B having a narrower width is disposed in a lower portion of a first upper conductivity-type semiconductor layer 131A. In addition, the first upper conductivity-type semiconductor layer 131A may be disposed to protrude from a first molded portion 161 to be described later in a predetermined thickness D.

An insulating layer 150 is disposed on a side surface of the light emitting structure 130, and blocks optical interference between the plurality of light emitting structures 130 and electrically separates the light emitting structures from each other. Moreover, the insulating layer 150 may be disposed to be in contact with a common first electrode 170N to be described later. The insulating layer 150 may be formed of a material having electrically insulating properties. For example, the insulating layer 150 may be a silicon oxide, a silicon oxynitride, or a silicon nitride. The insulating layer 150 may include a material having low light absorption or reflectivity, or a reflective structure.

On the first conductivity-type semiconductor layer 131 and the second conductivity-type semiconductor layer 133, the common first electrode 170N (refer to FIG. 2) and a second electrode 141 may be disposed, respectively. The common first electrode 170N may connect the first conductivity-type semiconductor layers 131, included in the plurality of light emitting structures 130, to each other. First and second electrode pads 175N and 175P for applying power to each of the first to third semiconductor light emitting portions LED1, LED2, and LED3 may be included. The first and second electrode pads 175N and 175P may be connected to the common first electrode 170N and the second electrode 141, respectively.

Referring to FIGS. 2 and 4A, the common first electrode 170N may include an individual electrode portion 170NA, a pad portion 170NC, and a connecting portion 170NB. The individual electrode portion 170NA may be disposed in a region overlapping the plurality of light emitting structures 130 and may be connected to each of the first conductivity-type semiconductor layers 131. Each of the individual electrode portions 170NA may be disposed to have a ring shape to surround the periphery (or circumference) of the first lower conductivity-type semiconductor layer 131B on a surface of the first upper conductivity-type semiconductor layer 131A of the light emitting structure 130. Through such a structure, distribution of a current supplied to the light emitting structure 130 may be performed quickly in the individual electrode portion 170NA.

The pad portion 170NC may be disposed in the molding region 20 of the display panel 1 not to overlap the plurality of light emitting structures 130. For example, the pad portion 170NC may be disposed in each edge of the display panel 1. The connecting portion 170NB may connect between the plurality of individual electrode portions 170NA, and may connect the individual electrode portion 170NA to the pad portion 170NC.

The common first electrode 170N is disposed on a surface in parallel to the first surface S1 and the second surface S2 of the light emitting structure 130, and thus may electrically connect side surfaces of a plurality of first conductivity-type semiconductor layers 131 to each other. Thus, the first electrode pad 175N and the second electrode pad 175P, disposed to apply power to the common first electrode 170N and the second electrode 141, may be configured to be disposed in regions different from each other. That is, the first electrode pad 175N may be disposed to be in contact with the pad portion 170NC disposed in the molding region 20 of the display panel 1, while the second electrode pads 175P may be disposed in lower portions of the plurality of light emitting structures 130. The common first electrode 170N may be formed of a material having a high melting point such as tungsten (W) and tungsten silicide (WS). The common first electrode 170N is embedded in the first conductivity-type semiconductor layer 131 during a manufacturing process, and is then exposed through a process of etching a region of the first conductivity-type semiconductor layer 131. Here, a high temperature heat treatment process is performed thereon to improve a contact performance of a light emitting structure. The material having a high melting point such as tungsten (W) and tungsten silicide (WS) is not dissolved in this process. However, in the case of a material having a relatively low melting point, the material may be damaged in a high temperature heat treatment and thus cannot function as an electrode.

The molded portion 160 may include a first molded portion 161 covering a side surface of the first to third semiconductor light emitting portions LED1, LED2, and LED3, a second molded portion 162 having a partition wall structure protruding between the first to third semiconductor light emitting portions LED1, LED2, and LED3 to separate the first to third wavelength converters 190R, 190G, and 190B from each other, and a third molded portion 163 exposing the first and second electrode pads 175N and 175P while covering the first molded portion 161.

The molded portion 160 may be formed of a material having a low modulus allowing the first substrate structure 100 to have a flexible characteristic. In detail, the first molded portion 161 may be formed of a material having a modulus lower than that of the light emitting structure 130 and having high tensile properties. For example, the first molded portion 161 may be formed of a material including one among polyimide (PI), polycyclohexylenedimethylene terephthalate (PCT), and an epoxy molding compound (EMC). Moreover, the first molded portion 161 may include light reflecting particles to reflect light. The light reflecting particles may be formed using a titanium dioxide ($TiO_2$) or an aluminum oxide ($Al_2O_3$), but are not limited thereto.

In an example embodiment, the first molded portion 161 may be formed of polycyclohexylenedimethylene terephthalate (PCT) and a white epoxy molding compound (white EMC), and have high reflectivity. In this case, even when an additional reflective layer is not provided, a sufficient light reflection effect may be expected based on the first molded portion 161. However, since a melting point of the material of the first molded portion 161 is equal to or less than 230° C., the material may be melted in a bonding process performed at a temperature equal to or more than 350° C. In this case, an appearance of the first molded portion 161 is deformed and cannot function as a molding. Thus, a third molded portion 163 may be provided on a lower portion of the first molded portion 161, the third molded portion 163 being a material layer such as polyimide (PI) having a melting point sufficiently high such that the material is not melted in a bonding process. For example, the third molded portion 163 may include at least one of polyimide (PI) and poly phenylene benzobisoxazole (PBO). In this regard, even if the first molded portion 161 is melted in a bonding process, an appearance thereof is maintained, so that a function as a molding may be also maintained.

The second molded portion 162 is formed to have a partition wall structure surrounding side surfaces of the first to third wavelength converters 190R, 190G, and 190B to separate the first to third wavelength converters from each other. Thus, the first to third wavelength converters 190R, 190G, and 190B may be separated from each other and disposed in upper portions of the first to third semiconductor light emitting portions LED1, LED2, and LED3. Thus, pieces of light, emitted by the first to third semiconductor light emitting portions LED1, LED2, and LED3, are not subjected to optical interference, and may be emitted through the first to third wavelength converters 190R, 190G, and 190B disposed in upper portions of the first to third semiconductor light emitting portions LED1, LED2, and LED3. The second molded portion 162 may be formed of a material including a black matrix. On an upper surface of the second molded portion 162, a reflective layer 182 formed of a metal material such as tungsten (W) and tungsten silicide (WS) may be disposed.

A wavelength conversion material such as a quantum dot (QD) may be filled in the partition wall structure of the molded portion 160, while being dispersed in a liquid binder resin, and then cured to form the first to third wavelength converters 190R, 190G, and 190B. In an example embodiment, the first and second wavelength converters 190R and 190G include a quantum dot, for wavelength conversion of blue light into red light and green light, and the third wavelength converter 190B may include only a binder resin without the quantum dot.

In detail, a liquid photosensitive resin composition in which a red quantum dot and a green quantum dot are dispersed in a binder resin is filled in the partition wall structure, and then cured to form the first and second wavelength converters 190R and 190G. The binder resin may be formed of a material including an acrylic based polymer.

On an upper portion of the first to third wavelength converters 190R, 190G, and 190B, the protective layer 400 preventing deterioration of the first to third wavelength converters 190R, 190G, and 190B may be disposed.

On a lower portion of the first substrate structure 100, the bonding layer 200 provided to be bonded to the second substrate structure 300 may be disposed. The bonding layer 200 may include an insulating bonding layer 210 and a conductive bonding layer 220, and the insulating bonding layer 210 may allow the first substrate structure 100 to be bonded to the second substrate structure 300. The insulating bonding layer 210 may be formed of a material having a composition the same as that of the molded portion 160 of the first substrate structure 100. The conductive bonding layer 220 is provided to allow the first and second electrode pads 175N and 175P of the first substrate structure 100 to be bonded to electrodes of the second substrate structure 300, and may be formed of a conductive material having a composition the same as those of the first and second electrode pads 175N and 175P. Thus, the first substrate structure 100 and the second substrate structure 300 may be bonded to each other through the bonding layer 200 and integrated.

The second substrate structure 300 may include a driving circuit including a plurality of thin film transistor (TFT) cells for controlling the light emitting device package LP1 of the first substrate structure 100. The plurality of TFT cells may form TFT circuitry for controlling driving of the plurality of pixels P. The plurality of TFT cells may be connected to correspond to the first to third semiconductor light emitting portions LED1, LED2, and LED3, respectively, through the conductive bonding layer 220 of the bonding layer 200. The plurality of TFT cells may include a semiconductor layer formed by injecting impurities into a semiconductor substrate. For example, a semiconductor layer included in the plurality of TFT cells may include a polysilicon and silicon-based semiconductor, a semiconductor oxide such as indium gallium zinc oxide, or a compound semiconductor such as silicon germanium.

Figure 4B:
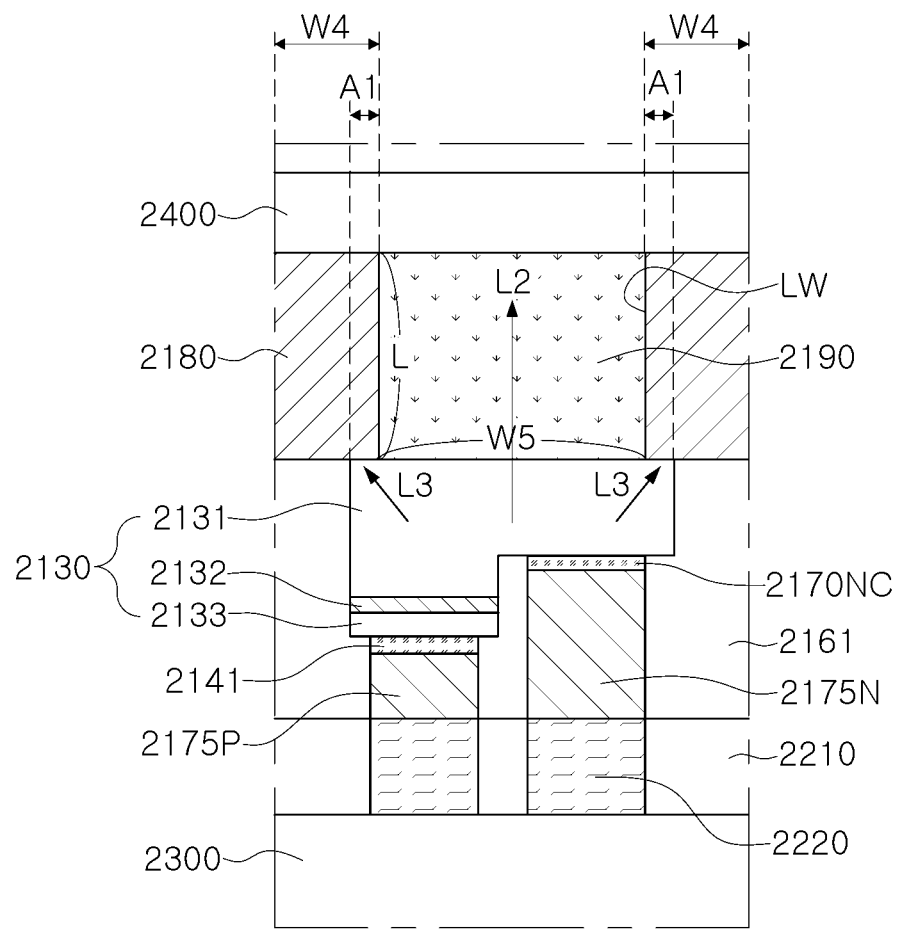
FIG. 4B illustrates a comparative example of a display panel of FIG. 4A.

The display panel 1 according to an example embodiment has an excellent aperture ratio, in comparison with the case in which a partition wall structure using a silicon substrate is used. This will be described with reference to FIGS. 4A and 4B. FIG. 4B illustrates a comparative example using a partition wall structure 2180 formed of a silicon substrate.

In FIG. 4B, elements denoted by reference numerals 2400, 2131, 2132, 2133, 2141, 2175P, 2170NC, 2161, 2175N, 2210, 2220, and 2300 correspond to respective elements denoted by reference numerals 400, 131, 132, 133, 141, 175P, 170NC, 161, 175N, 210, 2220, and 300 in FIG. 4A, and repetitive descriptions are omitted.

Referring to FIG. 4B, in the case of a comparative example, as a pixel density of a pixel is increased, a ratio between a height L of the partition wall structure 2180 and a width W5 of the light emitting window LW is increased. Thus, an aperture ratio may be reduced. Even if a pixel density is increased and thus a pixel is miniaturized, a thickness W4 of the partition wall structure 2180 cannot be reduced to be equal to or less than a predetermined value because structural rigidity of the partition wall structure 2180 needs to be maintained. That is, as a pixel density is increased and thus a size of the pixel P is reduced, a light emitting window LW, formed in the partition wall structure 2180, has a vertically long and narrow shape, and accordingly, a shape of the wavelength converter 2190 is also formed to be narrow and long. Thus, while light L3, emitted by the active layer 2132, travels along a long light emitting path, brightness may be further lowered.

Moreover, as a width L5 of the light emitting window LW is reduced, a ratio of an overlapping region A1 between the partition wall structure 2180 and a light emitting structure 2130 is increased due to tolerances in a manufacturing process. Here, in the overlapping region A1 between the partition wall structure 2180 and the light emitting structure 2130, light is absorbed by the partition wall structure 2180 or reflected downwardly, and thus cannot be emitted through the light emitting window LW. Therefore, if a ratio of the overlapping region A1 between the partition wall structure 2180 and the light emitting structure 2130 is increased, overall brightness of the display panel may be lowered.

In an example embodiment, a partition wall structure using a silicon substrate is replaced with a molded portion including a material with high reflectivity, and therefore, a wavelength converter having a substantially reduced thickness may be formed in comparison with a silicon partition wall structure. Thus, an example embodiment of the disclosure can solve the problem in the related art that brightness is reduced in a process of passing through a narrow and long wavelength converter.

Moreover, in an example embodiment, because a partition wall structure may become thin, an area of a wavelength converter may be wider in comparison with that of the light emitting structure 2130. Thus, an example embodiment of the disclosure can solve the problem that light, emitted by the active layer, is blocked by a partition wall structure.

Figure 5:
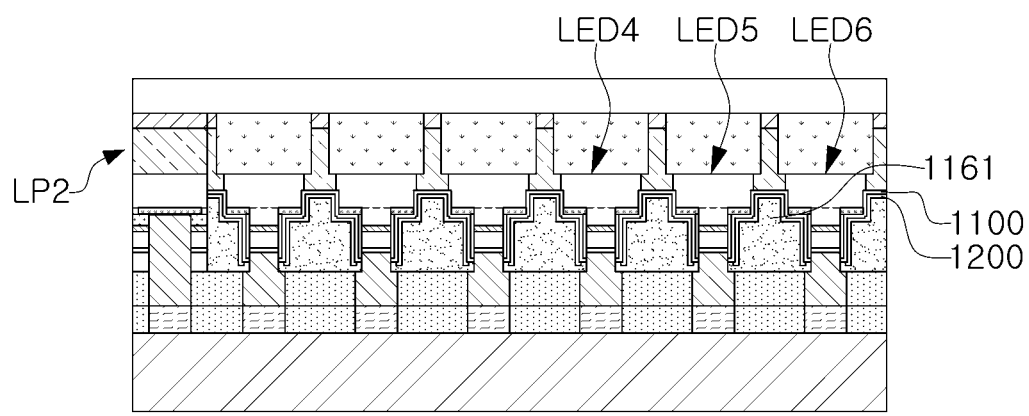
FIG. 5 is a side cross-sectional view of a display panel according to an example embodiment of the disclosure.

FIG. 5 is a cross-sectional view of a display panel 2 having a light emitting device package LP2 according to an example embodiment of the disclosure.

When comparing with the display panel 1 according to the example embodiment described previously, the display panel 2 of FIG. 5 has a difference in that the first molded portion 1161 is formed of PI, and because PI has relatively low reflectivity in comparison with PCT or EMC, a reflective layer 1200 is formed on a side surface of a first semiconductor light emitting portion LED4, a second semiconductor light emitting portion LED5, and a third semiconductor light emitting portion LED6, in terms of characteristics. In addition, an insulating layer 1100 is disposed between the reflective layer 1200 and the first to third semiconductor light emitting portions LED4, LED5, and LED6, thereby insulating the reflective layer 1200 from the first to third semiconductor light emitting portions LED4, LED5, and LED6. Otherwise, the example embodiment of FIG. 5 is similar to the above-described example embodiment, and thus redundant descriptions will be omitted.

Hereinafter, a process of manufacturing a display panel according to an example embodiment will be described. FIGS. 6 to 16 are schematic views illustrating a main process of manufacturing the display panel of FIG. 3.

Figure 6:
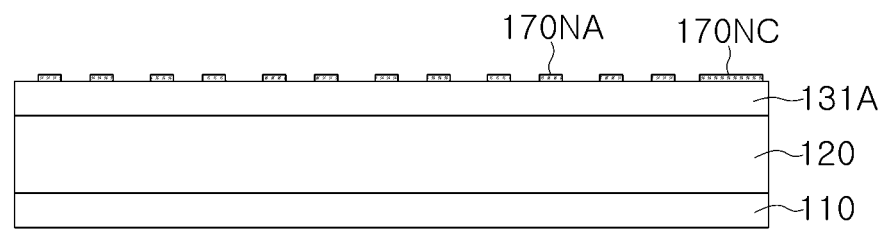
FIGS. 6 to 16 are schematic views illustrating a main process of manufacturing the display panel of FIG. 3.
Figure 7:
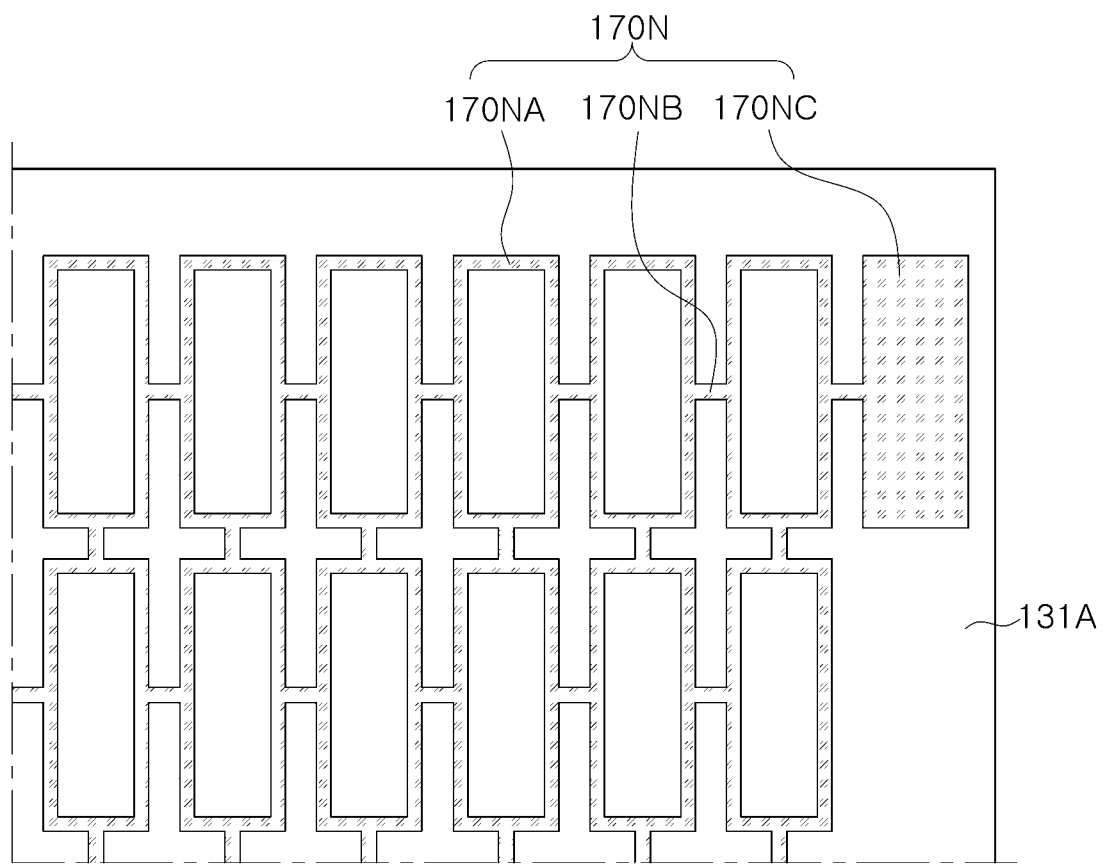

First, referring to FIG. 6, a buffer layer 120 is formed on a substrate for growth 110, and a first upper conductivity-type semiconductor layer 131A is formed on the buffer layer 120. An electrode pattern for formation of a common first electrode 170N may be formed on an upper surface of the first upper conductivity-type semiconductor layer 131A as illustrated in FIG. 7, a pad portion 170NC of the common first electrode 170N may be disposed in a corner of the first upper conductivity-type semiconductor layer 131A, and an individual electrode portion 170NA may be disposed in each region in which a plurality of light emitting structures are to be formed in a subsequent process. In addition, the pad portion 170NC and the individual electrode portion 170NA are connected by the connecting portion 170NB, so that the pad portion 170NC and the individual electrode portion 170NA may be electrically connected to each other. The common first electrode 170N may include tungsten (W) and tungsten silicide (WS) having a melting point which is high enough not to be melted in a high temperature semiconductor heat treatment process.

Figure 8:
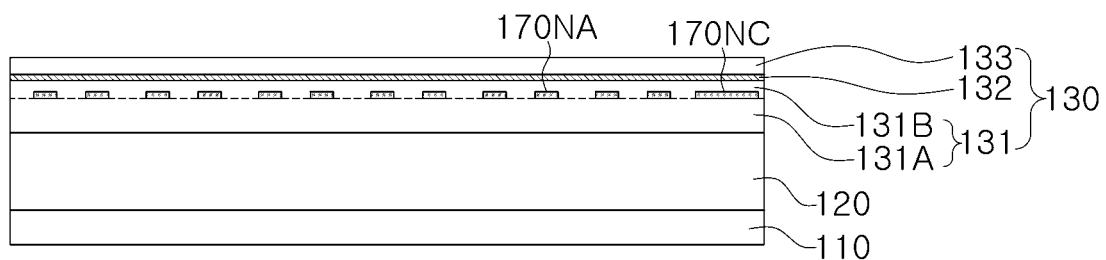

Referring to FIG. 8, on the first upper conductivity-type semiconductor layer 131A, a first lower conductivity-type semiconductor layer 131B may be formed to cover the common first electrode 170N. The first upper conductivity-type semiconductor layer 131A and the first lower conductivity-type semiconductor layer 131B are provided as a semiconductor layer formed of the same composition, and thus may be integrated as the first conductivity-type semiconductor layer 131. Thus, the common first electrode 170N may be embedded in the first conductivity-type semiconductor layer 131. Subsequently, on the first conductivity-type semiconductor layer 131, the active layer 132 and the second conductivity-type semiconductor layer 133 may be formed.

Figure 9:
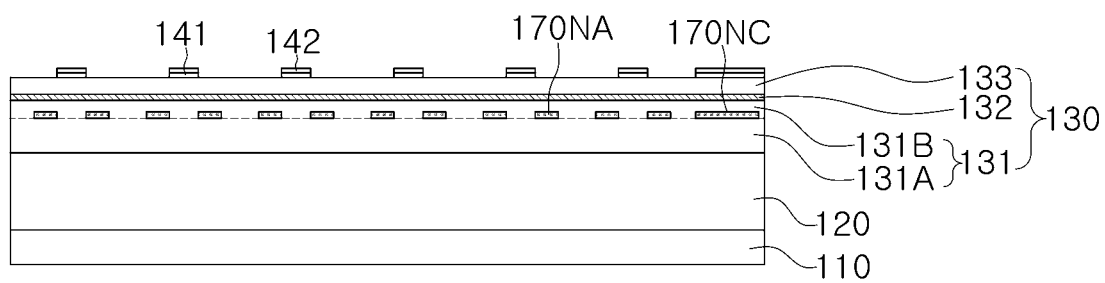

Referring to FIG. 9, a second electrode 141 may be formed on the second conductivity-type semiconductor layer 133, while a hard mask layer 142 may be formed on the second electrode 141. The hard mask layer 142 may prevent the second electrode 141 from being damaged in a subsequent process.

Figure 10:
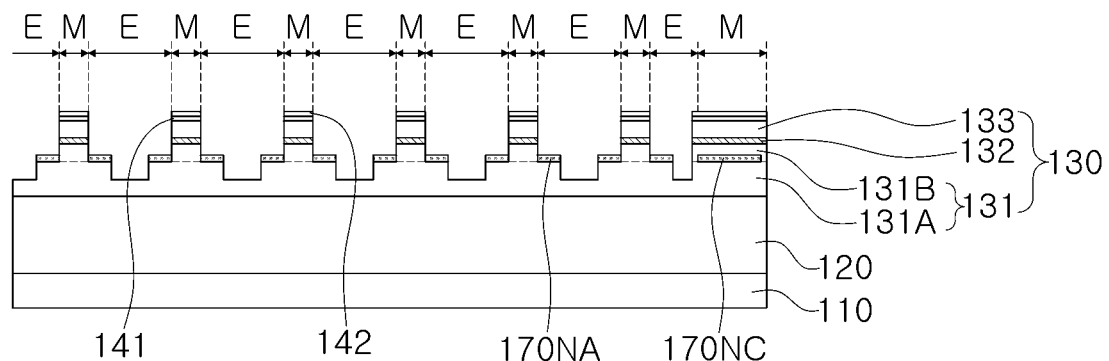
Figure 11:
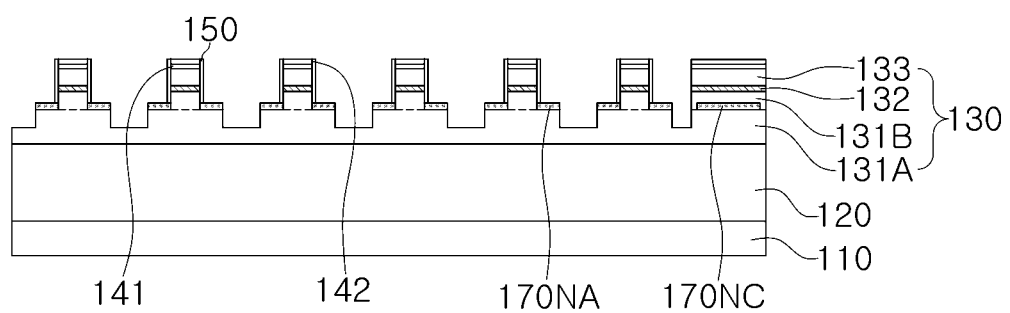

Referring to FIG. 10, a common first electrode 170N is used as an etching mask, and etching may be performed until the common first electrode 170N is exposed. As a result, some regions E of the light emitting structure 130 are etched to form a mesa region M. Referring to FIG. 11, on a side surface of the light emitting structure 130, the insulating layer 150 may be formed.

Figure 12:
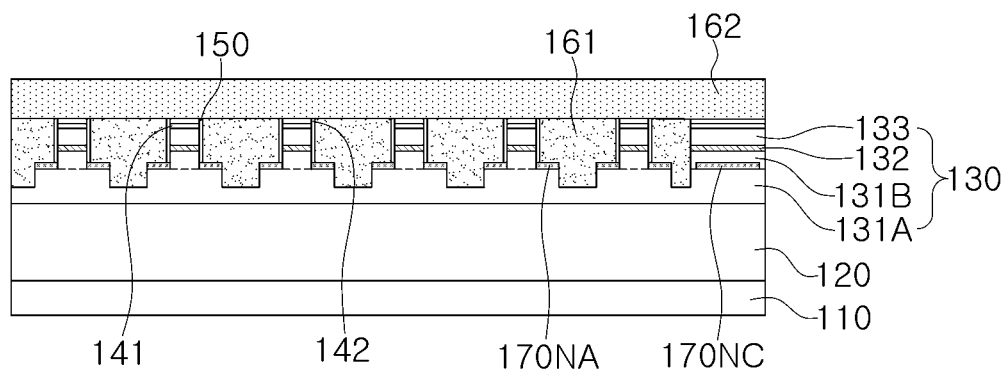
Figure 13:
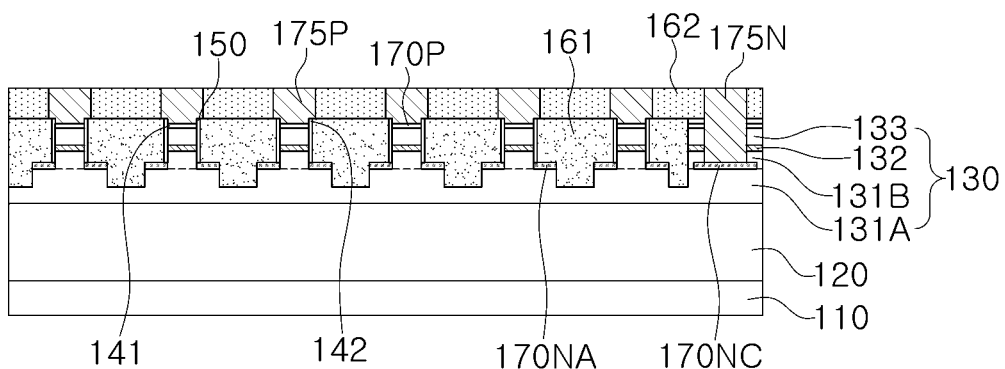

Referring to FIG. 12, a first molded portion 161 is formed to cover the light emitting structure 130 and a second molded portion 162 may be formed on the first molded portion 161. Referring to FIG. 13, a region of the second molded portion 162 is etched and a conductive material is plated to form a first electrode pad 175N and a second electrode pad 175P, in contact with the common first electrode 170N and the second electrode 141.

Figure 14:
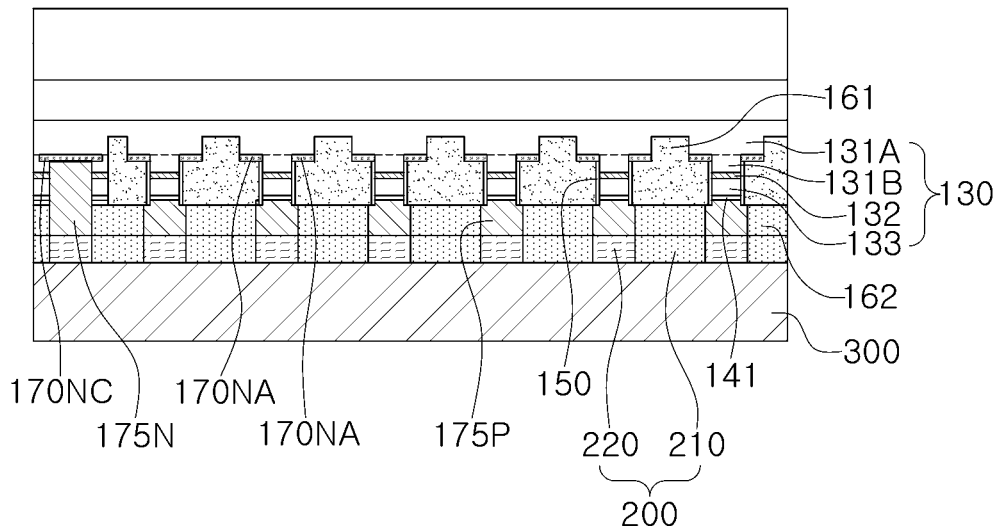

Referring to FIG. 14, a second substrate structure 300 may be attached to a lower portion of the second molded portion 162 of FIG. 13 while a bonding layer 200 including the insulating bonding layer 210 and the conductive bonding layer 220 is interposed between the second substrate structure 300 and the second molded portion 162. FIG. 14 may be understood that the first electrode pad 175N and the second electrode pad 175P of FIG. 13 are inverted to be disposed on a lower portion. The second substrate structure 300 may include a driving circuit including the plurality of TFT cells for controlling the first to third semiconductor light emitting portions LED1, LED2, and LED3. The plurality of TFT cells may include a semiconductor layer formed by injecting impurities into a semiconductor substrate. For example, a semiconductor layer forming the plurality of TFT cells may include a polysilicon and silicon-based semiconductor, a semiconductor oxide such as indium gallium zinc oxide, or a compound semiconductor such as silicon germanium. The semiconductor substrate may be doped with boron at a concentration equal to or less than $10^{16}/cm^{-3}$, a concentration lower than a doping concentration on the substrate for growth 110, in order to secure etch selectivity in a subsequent process of separating the substrate for growth 110.

Figure 15:
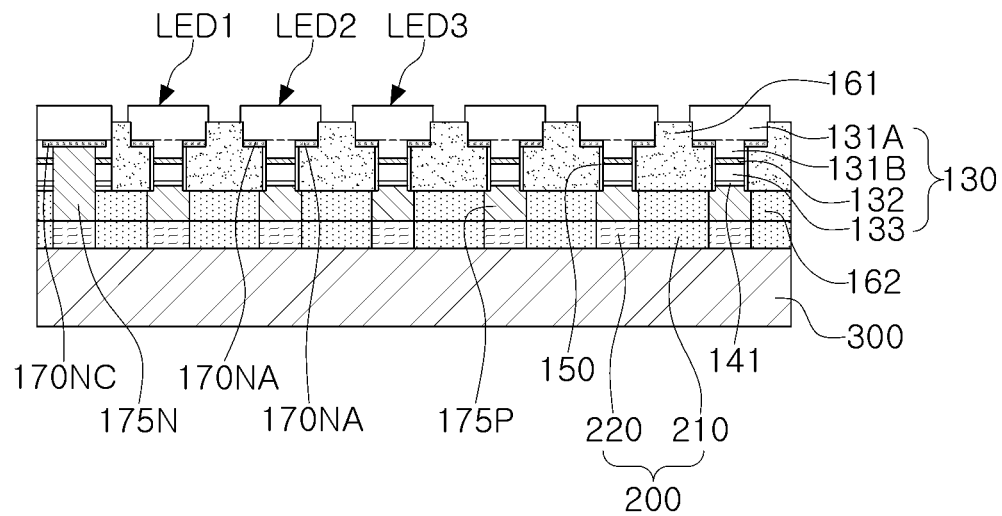

Referring to FIG. 15, a substrate for growth is separated from the first to third semiconductor light emitting portions LED1, LED2, and LED3 and wet etched, and an isolation (ISO) process for separating the first to third semiconductor light emitting portions LED1, LED2, and LED3 from each other may be performed.

Figure 16:
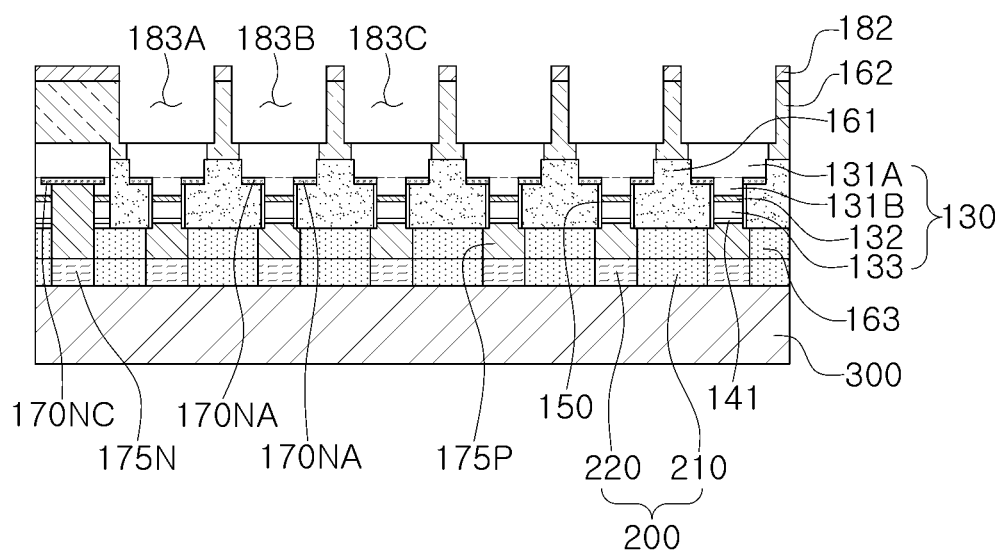

Referring to FIG. 16, a black matrix is applied to an upper portion of the light emitting structure 130 to form the second molded portion 162, and a reflective layer 182 is deposited thereon. Then, a region is etched to form groove portions 183A, 183B, and 183C for formation of the wavelength converter 190 in a subsequent process. Subsequently, a wavelength conversion material such as a quantum dot (QD) is filled in the groove portions while being dispersed in a liquid binder resin to form first to third wavelength converters 190R, 190G, and 190B, and a protective layer 400 is attached to an upper portion to manufacture the display panel 1 of FIG. 3.

A process of manufacturing a display panel according to an example embodiment will be described. FIGS. 17 to 20 are schematic views illustrating a main process of manufacturing the display panel of FIG. 5. The process described in FIG. 17 assumes the same or similar processes of the example embodiment described previously with reference to FIGS. 6 to 11, and is focused on subsequent processes thereof. Therefore, repetitive description of the processes will be omitted. In addition, when compared with the example embodiment described previously, the example embodiment of FIGS. 17-20 has a difference in that the first molded portion 1161 is formed of polyimide (PI).

Figure 17:
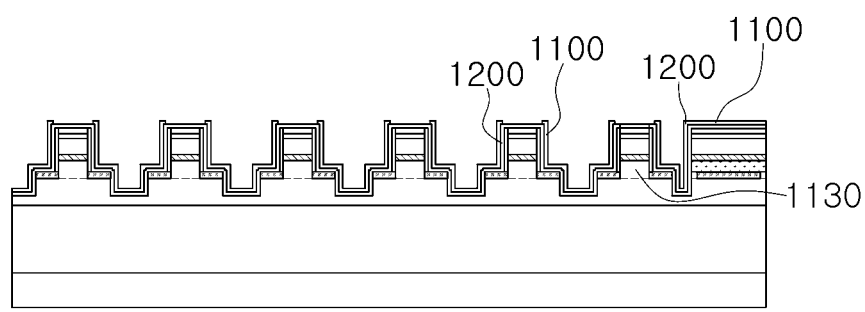
FIGS. 17 to 20 are schematic views illustrating a main process of manufacturing the display panel of FIG. 5.

Referring to FIG. 17, on a side surface of a light emitting structure 1130, the reflective layer 1200 may be formed. The reflective layer 1200 may be formed by depositing aluminum (Al) on a side surface of the light emitting structure 1130. The reflective layer 1200 is provided to compensate for low reflectivity, in comparison with PCT or EMC, of the first molded portion 1161 to be formed of PI in a subsequent process. An insulating layer 1100 for insulating the reflective layer 1200 and the light emitting structure 1130 may be interposed therebetween.

Figure 18:
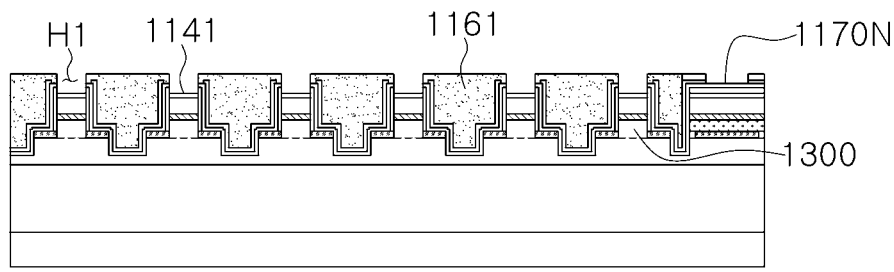

Referring to FIG. 18, in the light emitting structure 1130, the first molded portion 1161 may be formed. The first molded portion 1161 may be formed of polyimide (PI). An opening H1 is formed in the first molded portion 1161, thereby exposing the common first electrode 1170N and the second electrode 1141.

Figure 19:
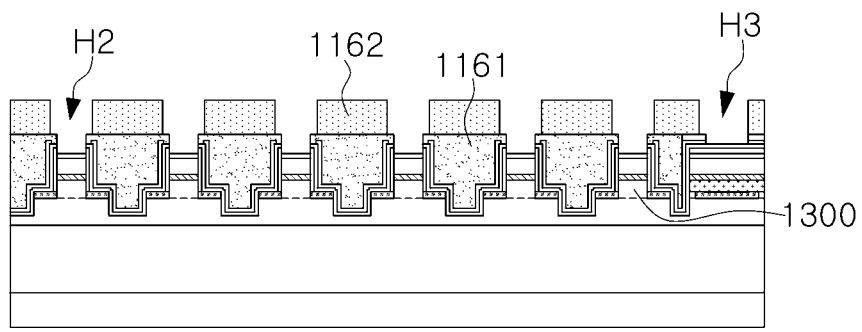

Referring to FIG. 19, a second molded portion 1162 is formed on the first molded portion 1161, and openings H2 and H3 are formed, thereby exposing the second electrode 1141. A second molded portion 1162 may be formed by coating a material of at least one of PI and poly phenylene benzobisoxazole (PBO).

Figure 20:
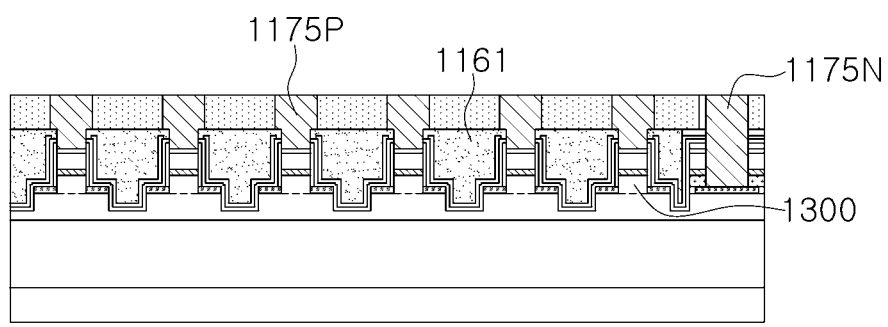

Referring to FIG. 20, a conductive material is disposed in each of openings H2 and H3 to form a first electrode pad 1175N and a second electrode pad 1175P, in contact with the common first electrode 1170N and the second electrode 1141.

Then, subsequent operations, described previously, are performed to manufacture the display panel 2 of FIG. 5.

As set forth above, according to example embodiments of the inventive concept, in a method of manufacturing a light emitting device package and a display panel using the same, the time consumed for manufacturing may be reduced and miniaturization may be easily obtained.

Moreover, a method of manufacturing a display panel having flexibility may be provided.

While example embodiments have been shown and described above, it will be apparent to those skilled in the art that modifications and variations could be made without departing from the scope of the disclosure, as defined by the appended claims.

What is claimed is:

1. A light emitting device package, comprising:
a plurality of light emitting structures spaced apart from each other, each of the plurality of light emitting structures having a first conductivity-type semiconductor layer, an active layer, and a second conductivity-type semiconductor layer, the first conductivity-type semiconductor layer defining a first surface extended in a first direction, and the second conductivity-type semiconductor layer defining a second surface extended in the first direction, the first surface facing the second surface;
a common first electrode extended in the first direction at a level lower than the first surface and higher than any of the second surface of each light emitting structure, the common first electrode connecting respective first conductivity-type semiconductor layers of the plurality of light emitting structures, and comprising at least one of tungsten (W) and tungsten silicide (WS);
a plurality of second electrodes disposed on second surfaces of the plurality of light emitting structures, and connected to respective second conductivity-type semiconductor layers of the plurality of light emitting structures;
a plurality of wavelength converters disposed on first surfaces of the plurality of light emitting structures and spaced apart from each other to correspond to the plurality of light emitting structures; and
a molded portion covering side surfaces of the plurality of light emitting structures and side surfaces of the plurality of wavelength converters, the molded portion having a partition wall structure separating the plurality of wavelength converters from each other, and comprising a material having an elastic modulus lower than an elastic modulus of the plurality of light emitting structures,
wherein, in the first surface, a width of each of the plurality of light emitting structures is smaller than a width of each of the plurality of wavelength converters.

2. The light emitting device package of claim 1, wherein the common first electrode is arranged on a surface disposed in parallel between the first surfaces and the second surfaces.

3. The light emitting device package of claim 2, wherein the common first electrode comprises:
a plurality of individual electrode portions disposed in a region overlapping the plurality of light emitting structures and connected to the respective first conductivity-type semiconductor layers;
at least one pad portion disposed in a region not overlapping the plurality of light emitting structures; and
a connecting portion connecting the plurality of individual electrode portions to each other, and connecting at least one of the plurality of individual electrode portions to the at least one pad portion.

4. The light emitting device package of claim 3, further comprising:
a first electrode pad passing through the molded portion and connected to the at least one pad portion; and
a second electrode pad passing through the molded portion and connected to each of the plurality of second electrodes.

5. The light emitting device package of claim 3, wherein each of the plurality of individual electrode portions is disposed to surround a circumference of a region of a corresponding light emitting structure.

6. The light emitting device package of claim 1, wherein, when viewed from the first surface, the plurality of light emitting structures are disposed in a region overlapping the plurality of wavelength converters.

7. The light emitting device package of claim 6, wherein, when viewed from the first surface, an area of each of the plurality of light emitting structures is smaller than an area of each of the plurality of wavelength converters.

8. The light emitting device package of claim 1, wherein the plurality of light emitting structures have respective stepped side surfaces, and
an area of the first surface is larger than an area of the second surface.

9. The light emitting device package of claim 1, wherein the molded portion comprises:
a first molded portion covering the side surfaces of the plurality of light emitting structures;
a second molded portion isolating the plurality of wavelength converters from each other; and
a third molded portion covering the first molded portion.

10. The light emitting device package of claim 9, wherein the first molded portion comprises at least one of polycyclohexylenedimethylene terephthalate (PCT) and an epoxy molding compound (EMC), and
the third molded portion comprises at least one of polyimide (PI) and poly phenylene benzobisoxazole (PBO).

11. The light emitting device package of claim 9, wherein the first molded portion comprises PI, and the second molded portion comprises PBO, and
a reflective layer is disposed between the first molded portion and the plurality of light emitting structures.

12. A light emitting device package, comprising:
a plurality of light emitting structures spaced apart from each other, each of the plurality of light emitting structures having a first conductivity-type semiconductor layer, an active layer, and a second conductivity-type semiconductor layer, the first conductivity-type semiconductor layer defining a first surface extended in a first direction, and the second conductivity-type semiconductor layer defining a second surface extended in the first direction, the first surface facing the second surface;
a plurality of wavelength converters disposed to correspond to the plurality of light emitting structures and spaced apart from each other;
a molded portion covering side surfaces of the plurality of light emitting structures and side surfaces of the plurality of wavelength converters and separating the plurality of light emitting structures and the plurality of wavelength converters from each other;
a common first electrode connecting respective first conductivity-type semiconductor layers of the plurality of light emitting structures to each other, the common first electrode being extended in the first direction at a level lower than the first surface and higher than any of the second surface of each light emitting structure; and
a plurality of second electrodes connected to second conductivity-type semiconductor layers, respectively, on second surfaces of the plurality of light emitting structures,
wherein, in the first surface, a width of each of the plurality of light emitting structures is smaller than a width of each of the plurality of wavelength converters.

13. The light emitting device package of claim 12, wherein the common first electrode comprises at least one of tungsten (W) and tungsten silicide (WS).

14. The light emitting device package of claim 12, wherein the molded portion comprises a material having an elastic modulus lower than an elastic modulus of the plurality of light emitting structures.

15. The light emitting device package of claim 12, wherein the molded portion comprises:
a first molded portion covering the side surfaces of the plurality of light emitting structures;
a second molded portion isolating the plurality of wavelength converters from each other; and
a third molded portion covering the first molded portion.

16. The light emitting device package of claim 15, wherein the second molded portion comprises a black matrix.

17. A display panel, comprising:
a first substrate structure comprising a plurality of light emitting device packages arranged in rows and columns, each of the plurality of light emitting device packages providing at least one pixel; and
a second substrate structure comprising a plurality of thin film transistor (TFT) cells corresponding to the plurality of light emitting device packages, respectively, and arranged at a lower portion of the first substrate structure,
wherein the plurality of light emitting device packages comprise:
a plurality of light emitting structures spaced apart from each other and providing a plurality of sub-pixels of a pixel, each of the plurality of light emitting structures having a first conductivity-type semiconductor layer, an active layer, and a second conductivity-type semiconductor layer, the first conductivity-type semiconductor layer defining a first surface extended in a first direction, and the second conductivity-type semiconductor layer defining a second surface extended in the first direction, the first surface facing the second surface;
a common first electrode connecting respective first conductivity-type semiconductor layers of the plurality of light emitting structures to each other and extended in the first direction at a level lower than the first surface and higher than any of the second surface of each light emitting structure;
a plurality of second electrodes disposed on second surfaces of the plurality of light emitting structures, and connected to respective second conductivity-type semiconductor layers of the plurality of light emitting structures;
a plurality of wavelength converters disposed on first surfaces of the plurality of light emitting structures and spaced apart from each other to correspond to the plurality of light emitting structures;
a molded portion covering side surfaces of the plurality of light emitting structures and side surfaces of the plurality of wavelength converters; and
a first electrode pad and a second electrode pad passing through the molded portion and respectively connecting each of the common first electrode and the plurality of second electrodes to a connection portion of the second substrate structure,
wherein, in the first surface, a width of each of the plurality of light emitting structures is smaller than a width of each of the plurality of wavelength converters.

18. A display panel of claim 17, wherein the common first electrode comprises at least one of tungsten (W) and tungsten silicide (WS).

19. The display panel of claim 17, wherein the pixel has a density equal to or more than 8000 pixels per inch (PPI).

20. The display panel of claim 17, wherein the plurality of light emitting structures are configured to emit light having substantially the same wavelength.

* * * * *